(12) United States Patent
Choi et al.

(10) Patent No.: US 7,869,189 B2
(45) Date of Patent: Jan. 11, 2011

(54) METHODS OF FABRICATING INTEGRATED CIRCUIT DEVICES INCLUDING CAPACITORS HAVING HIGH-ASPECT RATIO SUPPORT PATTERNS AND RELATED DEVICES

(75) Inventors: Yong-Hee Choi, Gyeonggi-do (KR); Young-Kyu Cho, Gyeonggi-do (KR); Sung-Il Cho, Seoul (KR); Seok-Hyun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 550 days.

(21) Appl. No.: 12/021,929

(22) Filed: Jan. 29, 2008

(65) Prior Publication Data

US 2008/0186648 A1 Aug. 7, 2008

(30) Foreign Application Priority Data

Feb. 1, 2007 (KR) .................. 10-2007-0010569

(51) Int. Cl.
*H01G 4/228* (2006.01)
(52) U.S. Cl. ............... 361/306.2; 361/311; 361/312; 361/306.1; 361/306.3; 361/328
(58) Field of Classification Search ............ 361/306.2, 361/306.1, 311–313, 301.4, 321.1, 328–330, 361/303–305; 257/295–296
See application file for complete search history.

(56) References Cited

U.S. PATENT DOCUMENTS

| | | | | |
|---|---|---|---|---|
| 6,693,299 | B1* | 2/2004 | Yamazaki et al. | 257/66 |
| 7,351,629 | B2* | 4/2008 | Choi et al. | 438/211 |
| 7,375,426 | B2* | 5/2008 | Kang et al. | 257/731 |
| 7,510,932 | B2* | 3/2009 | Oh et al. | 438/257 |
| 2005/0093046 | A1 | 5/2005 | Ahn | |
| 2005/0099760 | A1* | 5/2005 | Park | 361/306.3 |
| 2006/0046382 | A1 | 3/2006 | Yoon et al. | |
| 2010/0177459 | A1* | 7/2010 | Wu et al. | 361/303 |

FOREIGN PATENT DOCUMENTS

JP 2003-273247 A 9/2003

(Continued)

OTHER PUBLICATIONS

Notice to File a Response/Amendment to the Examination Report corresponding to Korean Patent Application No. 10-2007-0010569 mailed Jan. 16, 2008.

*Primary Examiner*—Nguyen T Ha
(74) *Attorney, Agent, or Firm*—Myers Bigel Sibley & Sajovec, P.A.

(57) ABSTRACT

A method of fabricating an integrated circuit device includes forming a plurality of lower capacitor electrodes vertically extending from a substrate. The plurality of lower capacitor electrodes respectively include an inner sidewall and an outer sidewall. At least one support pattern is formed vertically extending between ones of the plurality of lower capacitor electrodes from top portions thereof opposite the substrate and along the outer sidewalls thereof towards the substrate to a depth that is greater than a lateral distance between adjacent ones of the plurality of lower capacitor electrodes. A dielectric layer is formed on the support pattern and on outer sidewalls of the plurality of lower capacitor electrodes, and an upper capacitor electrode is formed on the dielectric layer. Related devices are also discussed.

23 Claims, 18 Drawing Sheets

FOREIGN PATENT DOCUMENTS

| | | |
|---|---|---|
| KR | 1020040000069 A | 1/2004 |
| KR | 1020040100502 A | 12/2004 |
| KR | 1020050000896 A | 1/2005 |
| KR | 1020050019500 A | 3/2005 |
| KR | 10-2005-0042624 A | 5/2005 |
| KR | 1020060018933 A | 3/2006 |

* cited by examiner

METHODS OF FABRICATING INTEGRATED CIRCUIT DEVICES INCLUDING CAPACITORS HAVING HIGH-ASPECT RATIO SUPPORT PATTERNS AND RELATED DEVICES

CROSS-REFERENCE TO RELATED APPLICATIONS

This U.S non-provisional patent application claims priority under 35 U.S.C §119 from Korean Patent Application No. 10-2007-0010569 filed on Feb. 1, 2007, the disclosure of which is hereby incorporated by reference herein in its entirety.

BACKGROUND OF THE INVENTION

The present invention relates to integrated circuit devices and methods of forming the same, and more particularly, to integrated circuit devices including storage capacitors and methods of forming the same.

A DRAM memory device typically includes a memory cell array and peripheral circuitry. A memory cell array is an assembly of memory cells that store data. Peripheral circuitry delivers data outside the DRAM device. A memory cell of a DRAM memory device includes one or more transistors and one or more capacitors. A transistor serves as a switch and a capacitor stores data. An important characteristic of DRAM memory devices is the capacitance of the memory cell capacitor which stores data. As such, methods of integrating capacitors with increased capacitance in smaller areas have become an important technology in DRAMs.

Design rules have become smaller as DRAM devices continue to be scaled down. In some instances, a "bridge" may occur between bottom electrodes (storage electrodes) of each cell, for example, due to misalignment during processing and/or smaller processing margins. The bridge may result in a defect called twin bit or multi-bit failure. More particularly, occurrence of the bridge problem in a stacked cell structure may be inversely proportional to the distance between the bottom electrodes. In other words, the occurrence of bridges may decrease as the distance between the bottom electrodes increases. However, as the usable surface area of the bottom electrodes decreases, the capacitance of the capacitor may also decrease.

A concave structure has been introduced that may address the above problem. A method of forming the concave structure may include forming a mold layer on a semiconductor substrate, etching the mold layer to form a bottom electrode hole, filling a bottom electrode material in the bottom electrode hole, planarizing the material to isolate the bottom electrodes for each cell, and removing the mold layer to expose the bottom electrodes. Other methods of forming the concave structure may include filling the contact hole with the bottom electrode material to form a box shape, or forming the bottom electrode material only on the internal wall of the contact hole to form a cylinder shape.

The bottom electrode may be formed to have a larger length or height compared to its width, in order to increase capacitance of the capacitor in a limited area. As a result, when the mold layer is removed and the bottom electrode is exposed, a bottom electrode with a high aspect ratio may collapse. Thus, a bridge between the bottom electrodes may occur.

SUMMARY OF THE INVENTION

In some embodiments of the present invention, a semiconductor device may include bottom electrodes each including internal wall and external wall on a semiconductor substrate; and at least one support pattern between the bottom electrodes, wherein the support pattern has thickness defined in a parallel direction to the external wall, and wherein the thickness is greater than the lateral distance between the bottom electrodes.

In other embodiments of the present invention, a method of forming a semiconductor device may include forming bottom electrodes each including internal wall and external wall on a semiconductor substrate; forming at least one support pattern between the bottom electrodes; forming a top electrode on the bottom electrodes; and forming a dielectric layer between the bottom electrodes and the top electrode, wherein the support pattern has thickness that is defined in a parallel direction to the external wall, and wherein the thickness is greater than the lateral distance between the bottom electrodes.

In further embodiments of the present invention, an integrated circuit device includes a plurality of lower capacitor electrodes vertically extending from a substrate. The plurality of lower capacitor electrodes respectively include an inner sidewall and an outer sidewall. At least one support pattern vertically extends between ones of the plurality of lower capacitor electrodes from top portions thereof opposite the substrate and along the outer sidewalls thereof towards the substrate to a depth that is greater than a lateral distance between adjacent ones of the plurality of lower capacitor electrodes. A dielectric layer extends on the support pattern and on outer sidewalls of the plurality of lower capacitor electrodes, and an upper capacitor electrode extends on the dielectric layer.

In some embodiments, at least one mold pattern may vertically extend between the ones of the plurality of lower capacitor electrodes from bottom portions thereof adjacent the substrate and along the outer sidewalls thereof away from the substrate. The support pattern may extend from the top portions of the ones of the plurality of lower capacitor electrodes and along the outer sidewalls thereof onto the mold pattern.

In other embodiments, the support pattern may have an etch selectivity to an etchant solution containing hydrofluoric acid. For example, the support pattern may be tantalum oxide.

In some embodiments, the plurality of lower capacitor electrodes may be titanium nitride.

In other embodiments, the dielectric layer may further extend on the inner sidewalls of the plurality of lower capacitor electrodes.

In some embodiments, a sacrificial pattern may extend on the inner sidewalls of the plurality of lower capacitor electrodes.

In other embodiments, the support pattern may extend between outer sidewalls of alternating ones of the plurality of lower capacitor electrodes.

In some embodiments, the dielectric layer may further extend on opposing surfaces of the support pattern.

In other embodiments, the plurality of lower capacitor electrodes may respectively comprise a cylindrically-shaped electrode vertically protruding from the substrate. The inner sidewall may be an inner surface of the cylindrically-shaped electrode that defines a cavity therein, and the outer sidewall may be an outer surface of the cylindrically-shaped electrode.

In still further embodiments of the present invention, a method of fabricating an integrated circuit device includes forming a plurality of lower capacitor electrodes vertically extending from a substrate. The plurality of lower capacitor electrodes respectively include an inner sidewall and an outer sidewall. At least one support pattern is formed vertically extending between ones of the plurality of lower capacitor electrodes from top portions thereof opposite the substrate and along the outer sidewalls thereof towards the substrate to a depth that is greater than a lateral distance between adjacent ones of the plurality of lower capacitor electrodes. A dielectric layer is formed on the support pattern and on outer sidewalls of the plurality of lower capacitor electrodes, and an upper capacitor electrode is formed on the dielectric layer.

In some embodiments, a mold layer including a plurality of recesses therein may be formed on the substrate, and a lower capacitor electrode layer may be conformally formed on the mold layer and along sidewalls of the plurality of recesses therein. A sacrificial layer may be formed on the lower capacitor electrode layer to substantially fill the plurality of recesses, and the sacrificial layer and the lower electrode layer may be planarized to expose the mold layer and define the plurality of lower capacitor electrodes and a sacrificial pattern on the inner sidewalls thereof.

In other embodiments, the exposed mold layer may be selectively recessed to form a mold pattern vertically extending between the plurality of lower capacitor electrodes from bottom portions thereof adjacent the substrate and along the outer sidewalls thereof away from the substrate. The mold pattern may expose upper portions of the outer sidewalls of the plurality of lower capacitor electrodes. A support layer may be formed on the mold pattern and the sacrificial pattern. The support layer may vertically extend between the plurality of lower capacitor electrodes and along the exposed upper portions of the outer sidewalls thereof towards the substrate. The support layer may be planarized to expose top portions of the plurality of lower capacitor electrodes and the sacrificial pattern to form a support insulation pattern. The support insulation pattern may be patterned to form the at least one support pattern vertically extending between the ones of the plurality of lower capacitor electrodes.

In some embodiments, the plurality of lower capacitor electrodes may be titanium nitride.

In other embodiments, the support layer may have an etch selectivity to an etchant solution containing hydrofluoric acid. For example, the support layer may be tantalum oxide.

In some embodiments, the mold layer may be selectively recessed using a wet etching process.

In other embodiments, a length of the exposed upper portions of the outer sidewalls of the plurality of lower capacitor electrodes along a direction parallel to the outer sidewalls may be greater than the lateral distance between immediately adjacent ones of the plurality of lower capacitor electrodes.

In some embodiments, a mask pattern may be formed on portions of the support insulation pattern and overlapping portions of the ones of the plurality of lower capacitor electrodes. The support insulation pattern may be etched to expose the mold pattern using the mask pattern as a etch mask. For example, the mask pattern may be formed on overlapping portions of alternating ones of the plurality of lower capacitor electrodes.

In other embodiments, after the support pattern is formed, portions of the mold pattern may be substantially removed to expose the outer sidewalls of the plurality of lower capacitor electrodes. The sacrificial pattern may be substantially removed to expose the inner sidewalls of the plurality of lower capacitor electrodes. The dielectric layer may be formed on the exposed inner and outer sidewalls of the plurality of lower capacitor electrodes.

In some embodiments, the support pattern may have an etch selectivity to the sacrificial pattern and the mold pattern.

In other embodiments, after the support pattern is formed, the portions of the mold pattern may be substantially removed without substantially removing the sacrificial pattern to expose the outer sidewalls of the plurality of lower capacitor electrodes. The dielectric layer may be formed on the exposed outer sidewalls of the plurality of lower capacitor electrodes.

In some embodiments, the support pattern and the sacrificial pattern may have an etch selectivity to the mold pattern.

BRIEF DESCRIPTION OF THE DRAWINGS

FIGS. 1-14 are described herein using following reference numbers:

Figure 1:
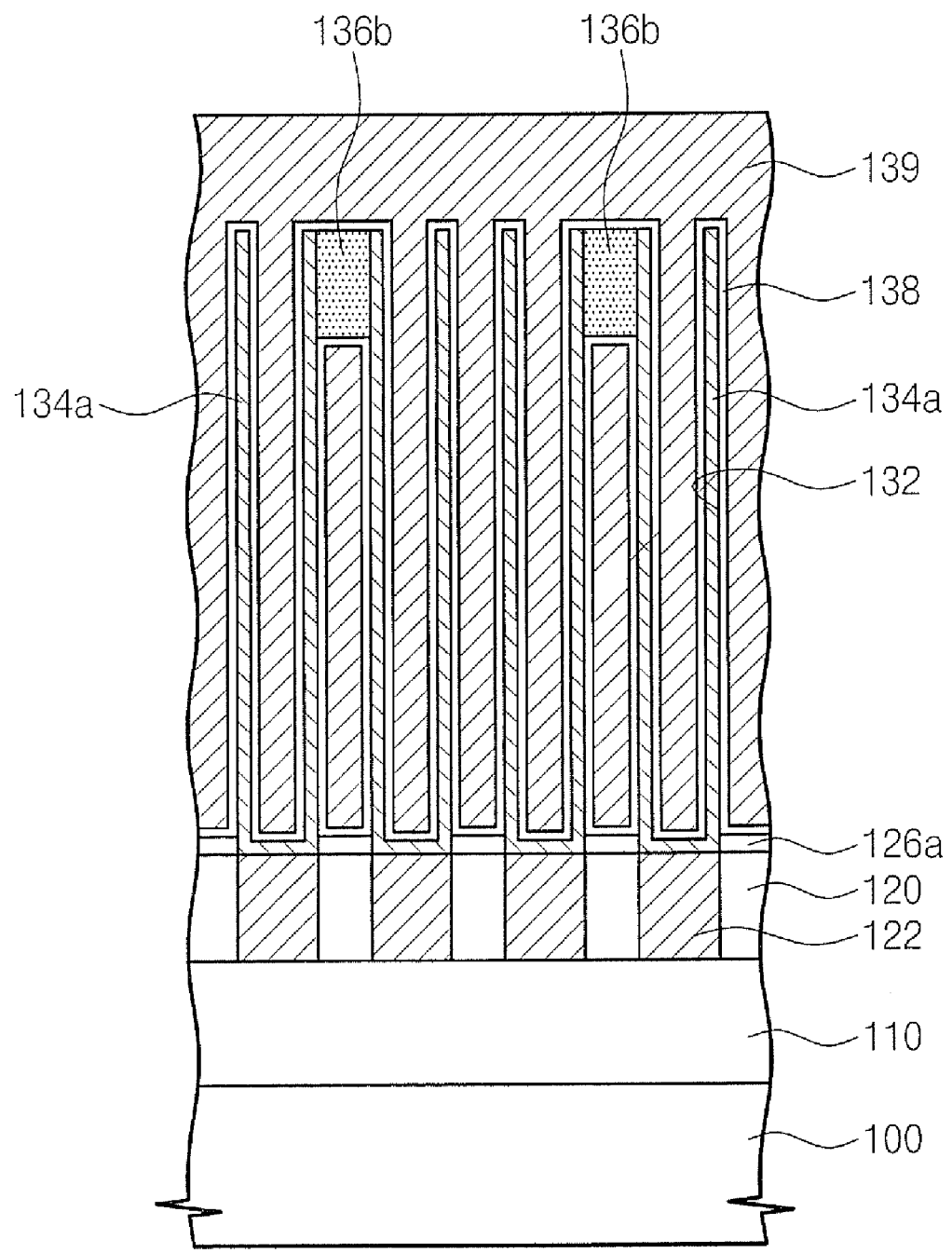
FIG. 1 is a cross-sectional view of a semiconductor device according to some embodiments of the present invention.

100: semiconductor substrate
 110: first interlayer dielectric
 120: second interlayer dielectric
 122: contact plug
 134a: bottom or lower capacitor electrode
 136b: support pattern
 138: dielectric layer
 139, 139a: top or upper capacitor electrode

DETAILED DESCRIPTION OF EMBODIMENTS OF THE INVENTION

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

FIG. 1 is a cross-sectional view of a semiconductor device according to some embodiments of the present invention.

Referring now to FIG. 1, a first interlayer dielectric 110 is provided on a semiconductor substrate 100. The first interlayer dielectric 110 may be made of silicon oxide ($SiO_2$). The first interlayer dielectric 110 may include a source region (not shown) formed on the semiconductor substrate 100 and an electrically connected conductor (not shown). A second interlayer dielectric 120 is provided on top of the first interlayer dielectric 110. The second interlayer dielectric 120 may be made of silicon oxide ($SiO_2$). A contact plug 122 extending through the second interlayer dielectric 120 is provided. The contact plug 122 may be connected with the conductor. A mask pattern 126a exposing the contact plug 122 is provided on the second interlayer dielectric 120. The mask pattern 126a may contain silicon nitride (SiN).

Bottom or lower capacitor electrodes 134a each including internal (or inner) sidewalls and external (or outer sidewalls) are provided on the exposed contact plug 122. For example, the bottom electrodes 134a may be substantially cylindrically-shaped such that the outer sidewalls provide an outer surface of each electrode 134a and the inner sidewalls provide an inner surface of each electrode 134a and define a cavity therein. The bottom electrode 134a may be a storage electrode of the capacitor. For example, the bottom electrode 134a may contain titanium nitride (TiN). The bottom electrode 134a is in contact with an upper surface of the contact plug 122.

At least one support pattern 136b is interposed between immediately adjacent ones of the bottom electrodes 134a. The support pattern 136b has an etch selectivity to an etchant solution containing hydrofluoric acid (HF). For example, the support pattern 136b may contain tantalum oxide (TaO). The support pattern 136b may have a thickness that is defined in a direction parallel to the outer sidewalls of the bottom electrodes 134a, that is, in a substantially vertical direction. The thickness of the support pattern 136b may be greater than the lateral distance between adjacent bottom electrodes 134a. In other words, the support pattern 136b vertically extends toward the substrate 100 along the outer sidewalls of the bottom electrodes 134a to a depth greater than a distance between adjacent bottom electrodes 134a. Accordingly, the support pattern 136b may have a relatively high aspect ratio.

The support pattern 136b may be disposed in various forms. For example, the support pattern 136b may be interposed between consecutive ones of the bottom electrodes 134a. Also, the support pattern 136b may be disposed between alternating pairs of the bottom electrodes 134a. The support pattern 136b are therefore disposed in various forms to support the bottom electrodes 134a.

A dielectric layer 138 is provided on both the internal surface and the external surface of the bottom electrodes 134a and on an upper surface of the support pattern 136b. The dielectric layer 138 may be the dielectric layer of the capacitor. In some embodiments, the dielectric layer 138 may extend on more than one surface of the support pattern 136b, for example, on opposing upper and lower surfaces of the support pattern 136b. A top or upper electrode 139 is disposed on the dielectric layer 138. The top electrode 139 may be a plate electrode of the capacitor.

FIGS. 2 to 8, FIG. 9A, FIG. 10A, FIG. 11A and FIG. 12A are cross-sectional views illustrating methods of forming a semiconductor device according to some embodiments of the present invention.

Figure 2:
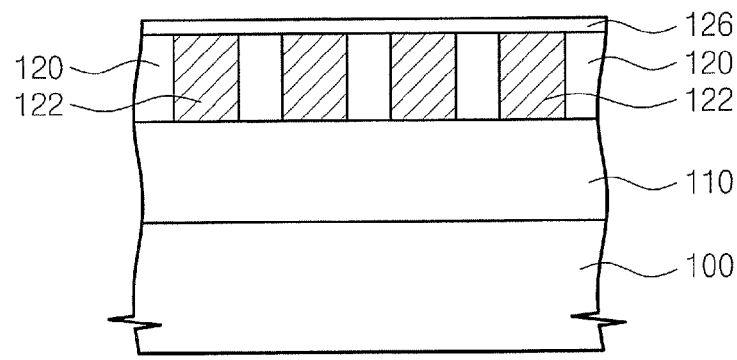
FIGS. 2 to 8, FIG. 9A, FIG. 10A, FIG. 11A and FIG. 12A are cross-sectional views illustrating methods of forming semiconductor devices according to some embodiments.

Referring to FIG. 2, a first interlayer dielectric 110 may be formed on the semiconductor substrate 100. The first interlayer dielectric 110 may be made of silicon oxide ($SiO_2$). The first interlayer dielectric 110 may include a source region (not shown) formed on the semiconductor substrate 100 and an electrically connected conductor (not shown). A second interlayer dielectric 120 may be formed on the first interlayer dielectric 110. The second interlayer dielectric 120 may also be made of silicon oxide. Contact plugs 122 which extend through the second interlayer dielectric 120 are provided. The contact plugs 122 are electrically connected with the conductor. A first mask layer 126 is formed on the second interlayer dielectric 120 and on the upper surfaces of the contact plugs 122. The first mask layer 126 may be made of silicon nitride (SiN). The first mask layer 126 may be an etch stop layer.

Figure 3:
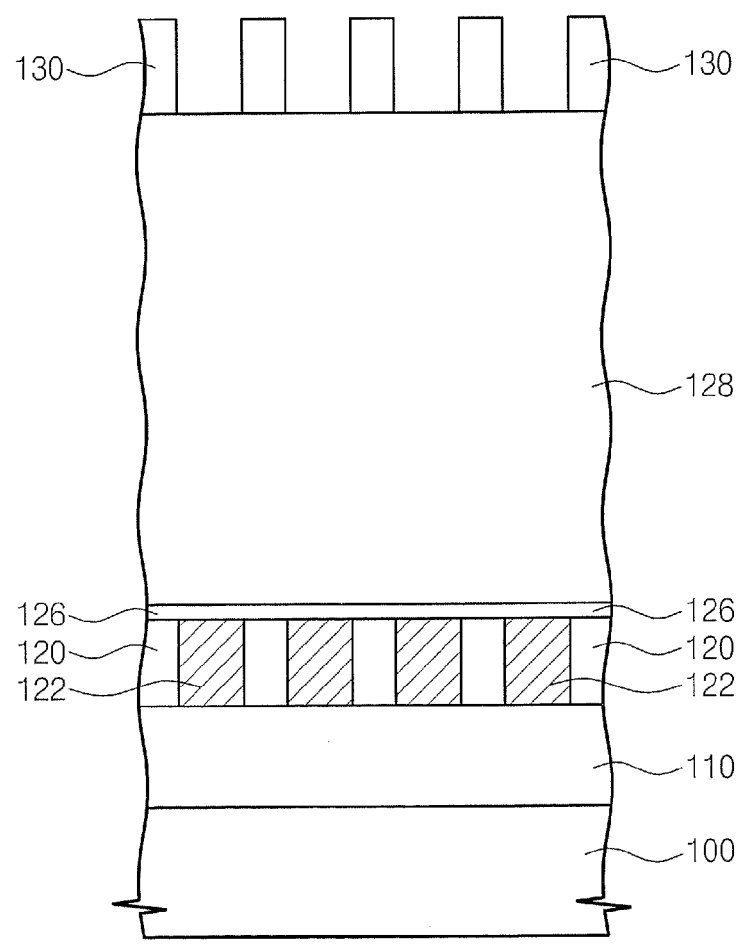

Referring to FIG. 3, a mold layer 128 is formed on the first mask layer 126. The mold layer 128 may be one of silicon oxide ($SiO_2$), silicon germanium (SiGe), silicon (Si), or a type of carbon. A second mask pattern 130 is formed on the mold layer 128. The second mask pattern 130 may be a photoresist pattern.

Figure 4:
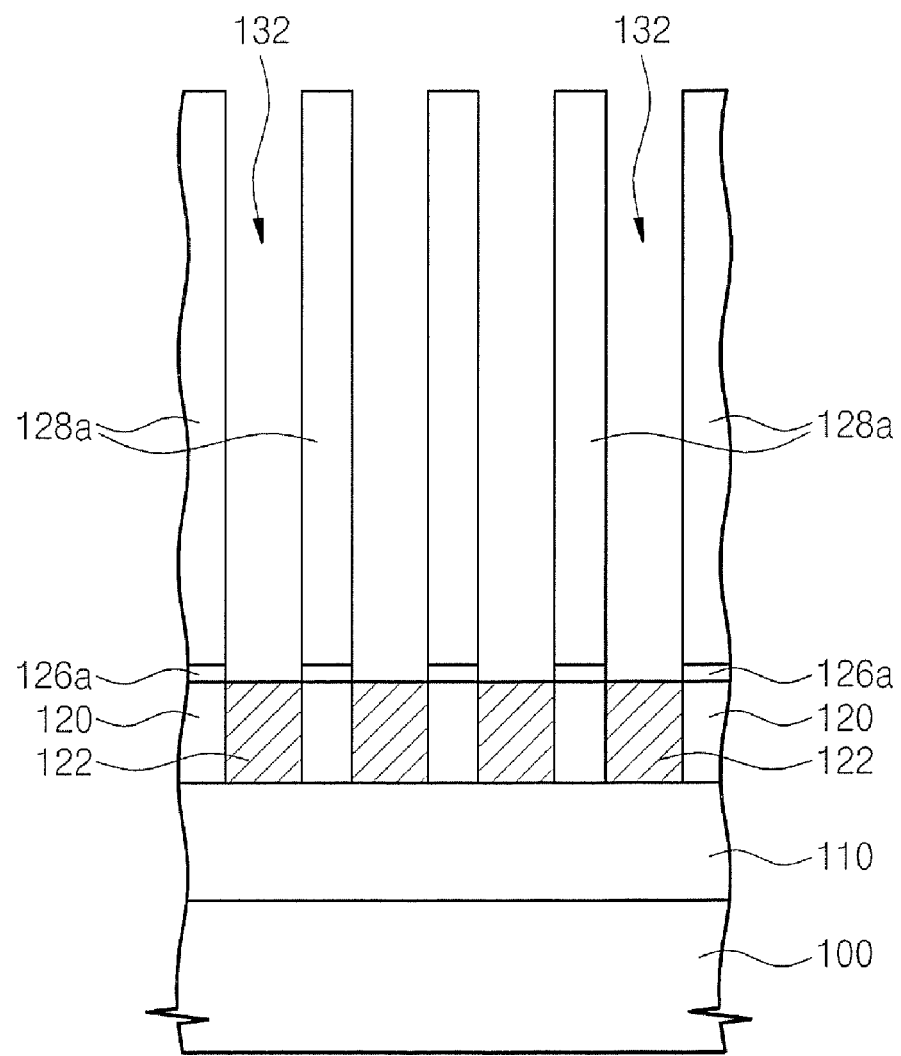

Referring to FIG. 4, the first openings or holes are formed by etching the mold layer 128 until the first mask layer 126 is exposed, using the second mask pattern 130 as the etch mask. The second mask pattern 130 may be removed. An ashing step may be used as the eliminating process. Second holes 132 extending from the surface of the mold layer 128 to the contact plugs 122 are formed by etching the exposed portions of the first mask layer 126 until the contact plugs 122 are exposed. The etching is performed using the mold layer 128a having the holes as the etch mask to define first mask patterns 126a.

Figure 5:
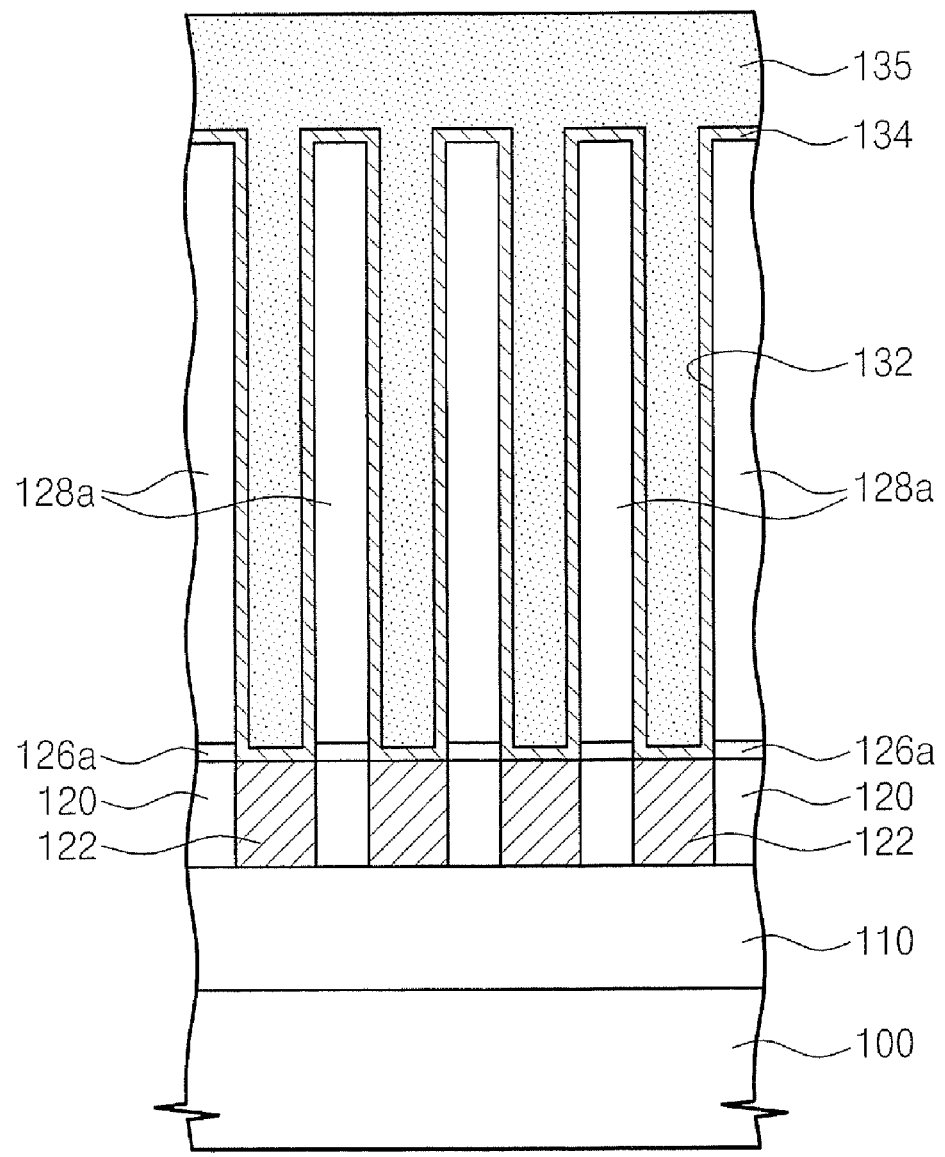

Referring to FIG. 5, the bottom electrode layer 134 is formed conformally on the mold layer 128a having the second holes 132 therein. The bottom electrode layer 134 may be made of titanium nitride (TiN) or polysilicon. The bottom electrode layer 134 is in electrical and physical contact with the exposed top or upper surfaces of the contact plugs 122. A sacrificial layer 135 is formed on the bottom electrode layer 134 to fill the holes 132. The sacrificial layer 135 may have an etch selectivity with respect to the mold layer 128a and the bottom electrode layer 134. Also, the sacrificial layer 135 may be made of a material with relatively good fluidity. For example, the sacrificial layer 135 may be made of silicon oxide or a photoresist layer.

Figure 6:
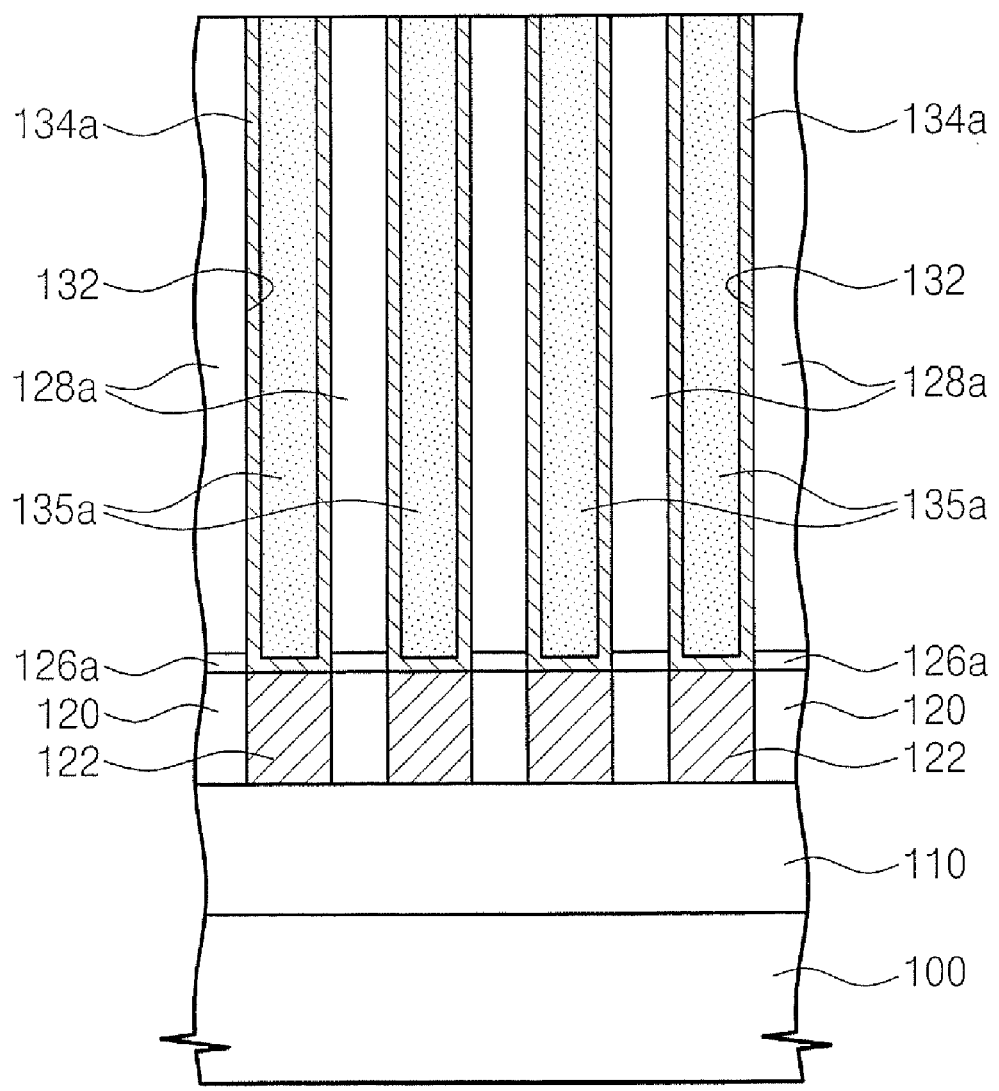

Referring to FIG. 6, the sacrificial layer 135 and the bottom electrode layer 134 are planarized until the mold layer 128a is exposed, to form a sacrificial pattern 135a and bottom electrodes 134a. The planarization process may be a chemical-mechanical polishing. The bottom electrodes 134a may be storage electrodes for respective capacitors.

Figure 7:
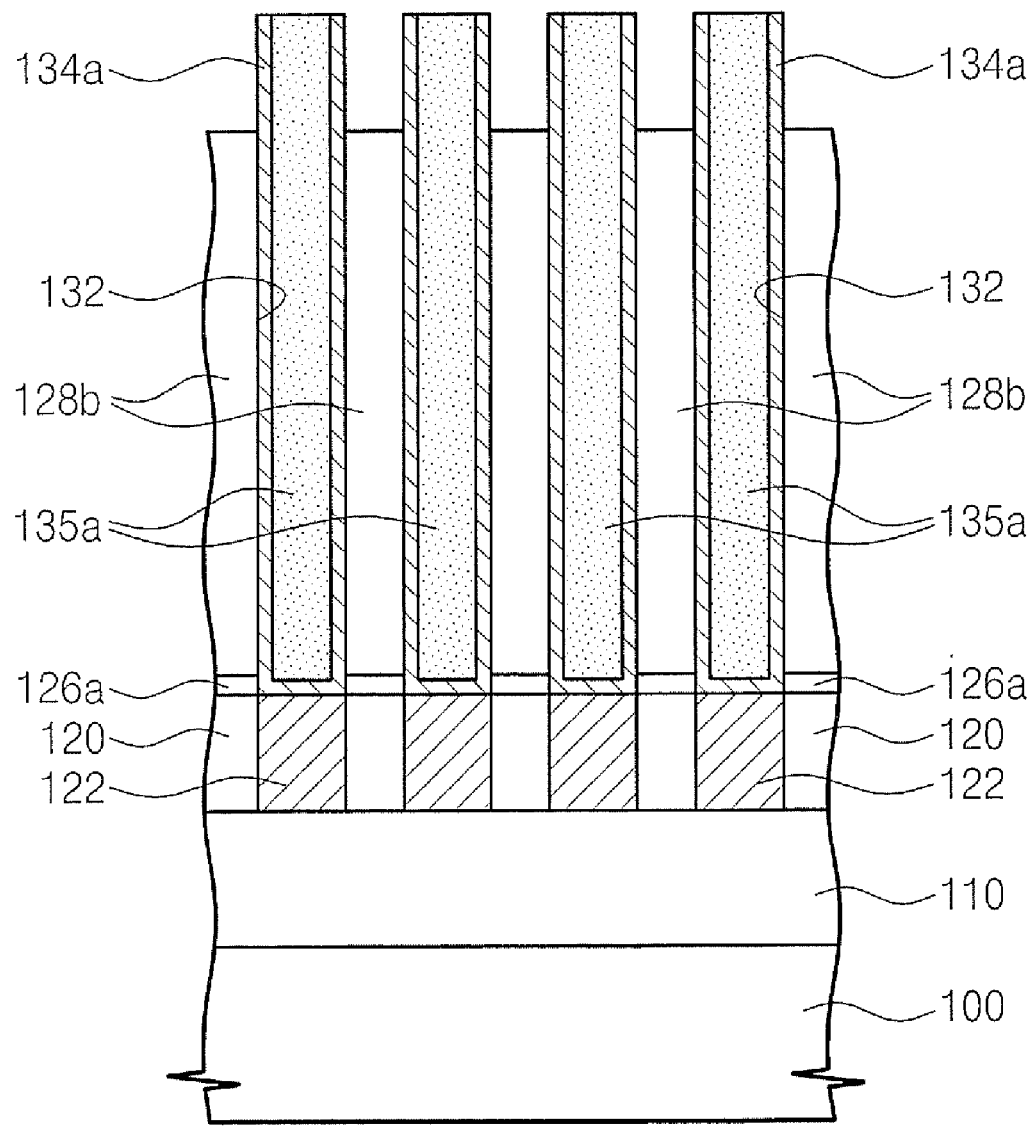

Referring to FIG. 7, the mold layer 128a is selectively recessed to form a mold pattern 128b that exposes the external or outer surfaces of upper portions of adjacent bottom electrodes 134a. The recess process may be a wet etch process. The length of the exposed external surfaces along the sidewalls of the bottom electrodes 134a may be greater than the distance between adjacent bottom electrodes 134a. Accordingly, the upper portions of the bottom electrodes 134a including portions of the sacrificial pattern 135a protrude from the recessed surface of the mold pattern 128b. The top surfaces of the sacrificial pattern 135a and the bottom electrodes 134a may be substantially coplanar.

Figure 8:
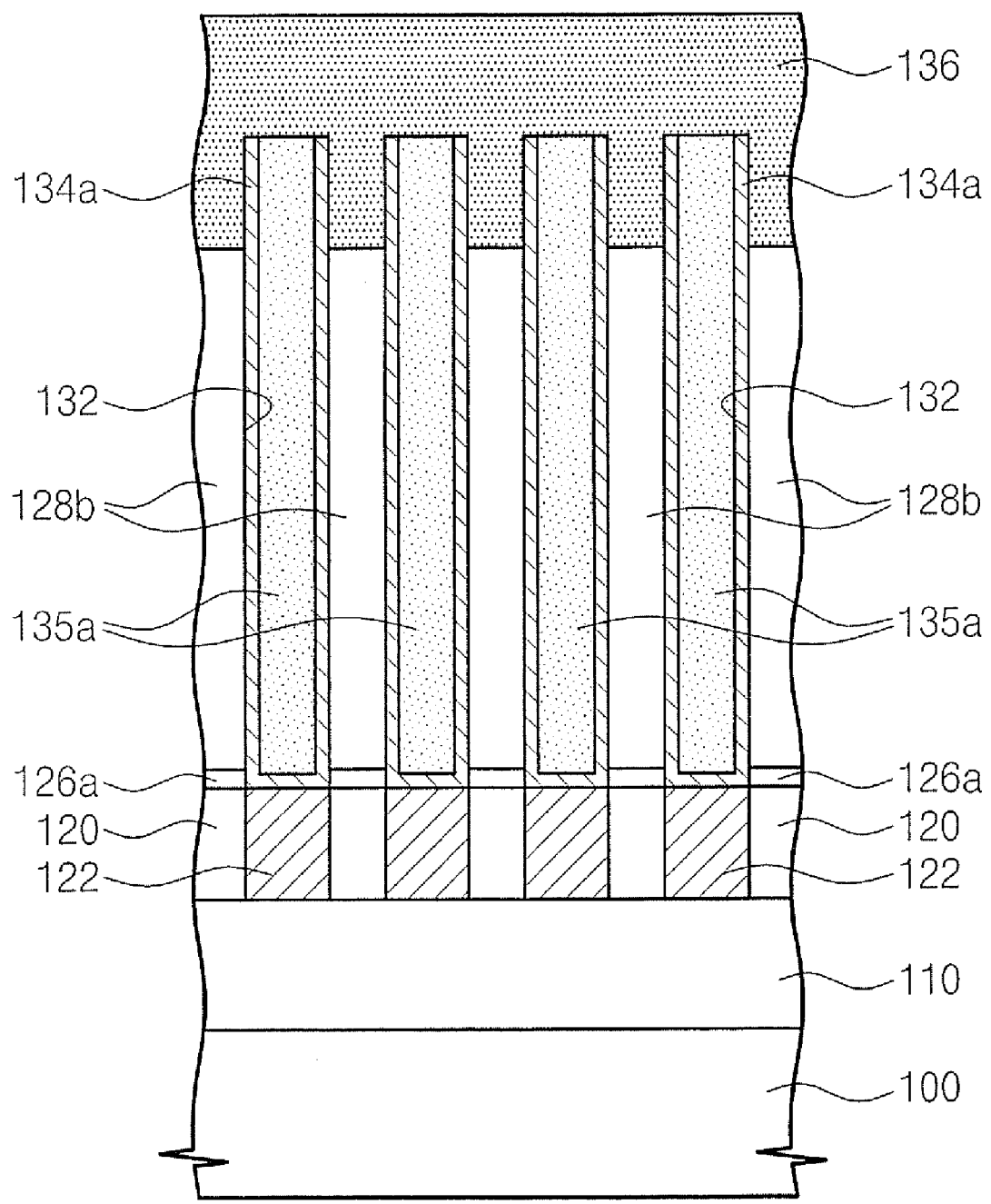

Referring to FIG. 8, a support layer 136 is formed on the mold pattern 128b to cover the exposed upper portions of the bottom electrodes 134a including the sacrificial pattern 135a. The support layer 136 has an etch selectivity with respect to an etchant solution containing hydrofluoric acid (HF). Also, the support layer 136 may have an etch selectivity to the mold pattern 128b and the sacrificial pattern 135a. The support layer 136 may be made of a material having relatively good adhesion to the bottom electrodes 134a. For example, the support layer 136 may be made of tantalum oxide (TaO).

FIGS. 9B to 12B are plan views illustrating methods of forming a semiconductor device according to some embodiments of the present invention. FIGS. 9A to 12A are cross-sectional views along the line I-I' of FIGS. 9B to 12B.

Figure 9A:
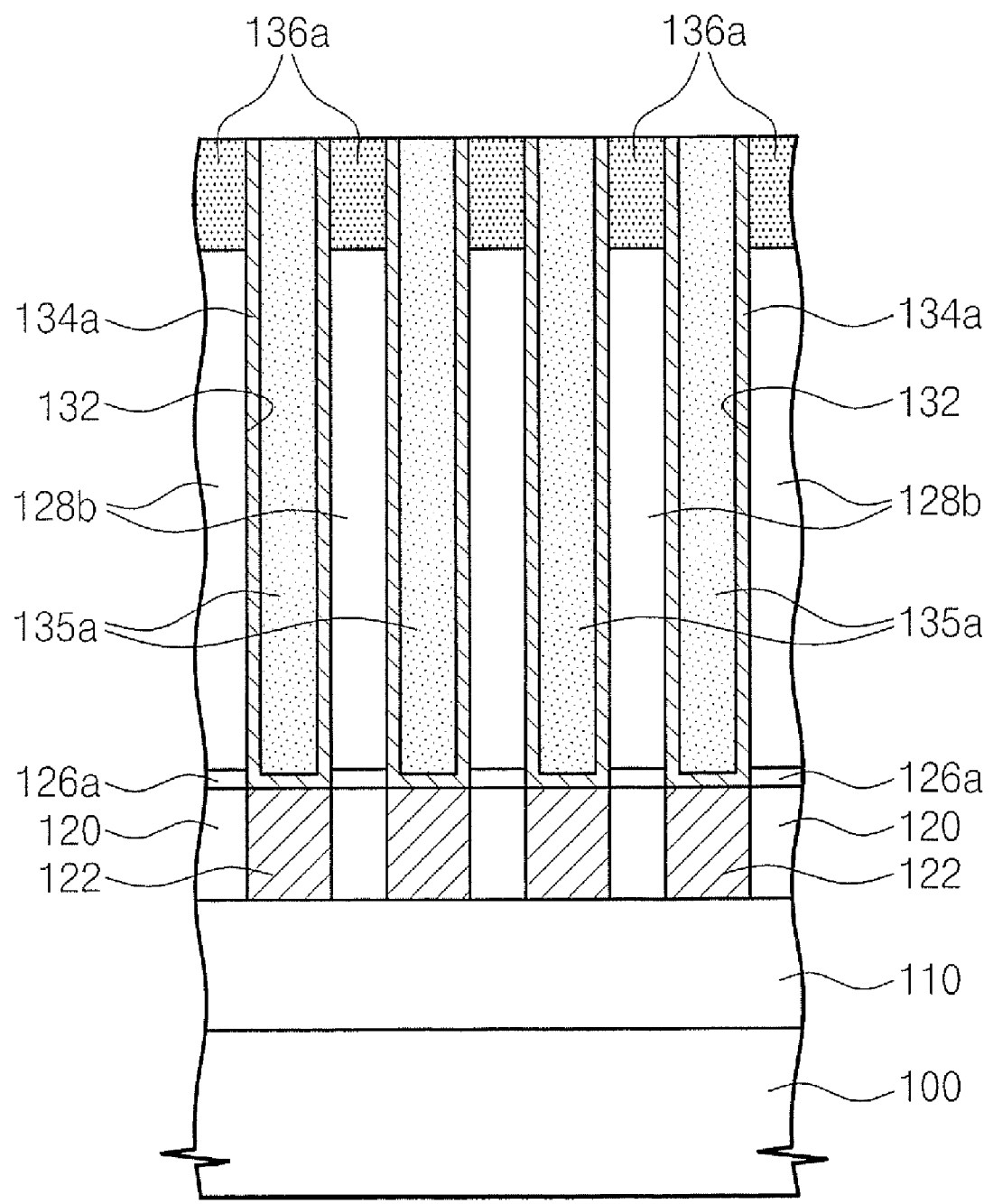
Figure 9B:
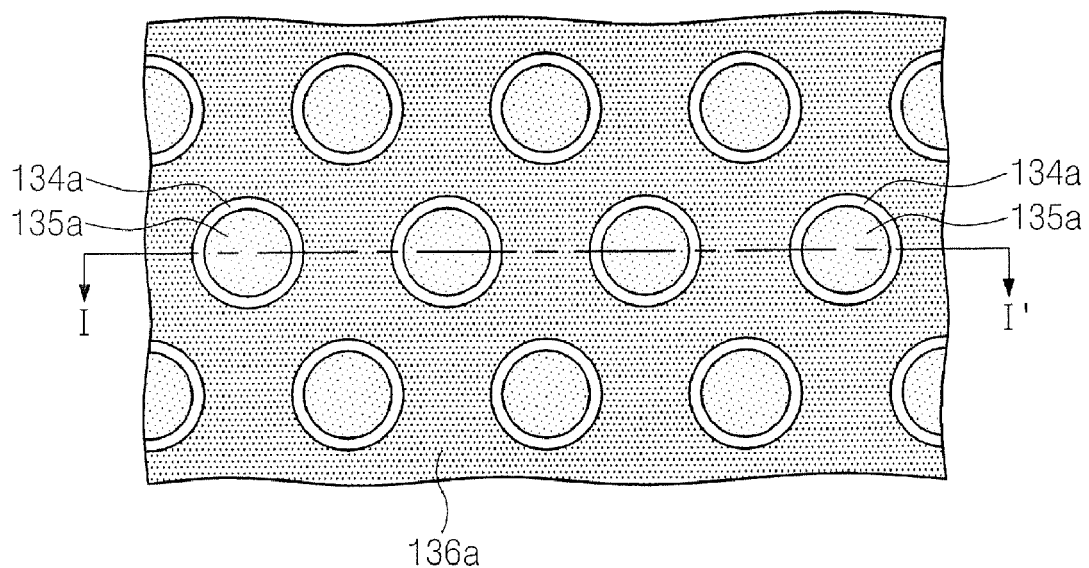
FIG. 9B, FIG. 10B, FIG. 11B and FIG. 12B are plan views illustrating methods of forming semiconductor devices according to some embodiments.

Referring to FIG. 9A and FIG. 9B, after forming the support layer 136 in FIG. 8, the support layer 136 is planarized until the bottom electrodes 134a are exposed to form support insulation patterns 136a between adjacent bottom electrodes 134a. The planarization process may be a chemical-mechanical polishing. The width or depth of the support insulation pattern 136a extending along the outer sidewalls of the bottom electrodes 134a may be greater than the distance between adjacent bottom electrodes 134a.

Figure 10A:
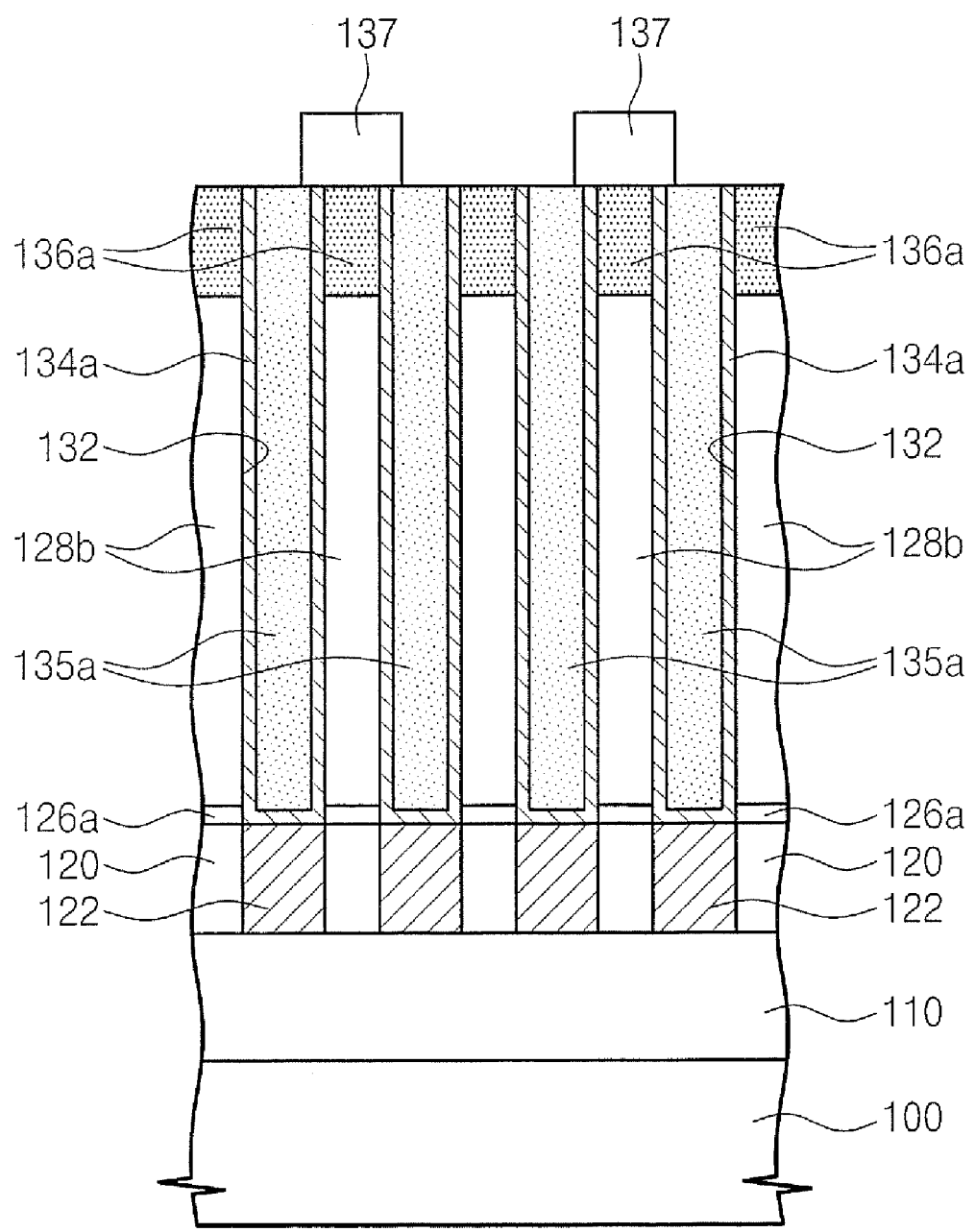
Figure 10B:
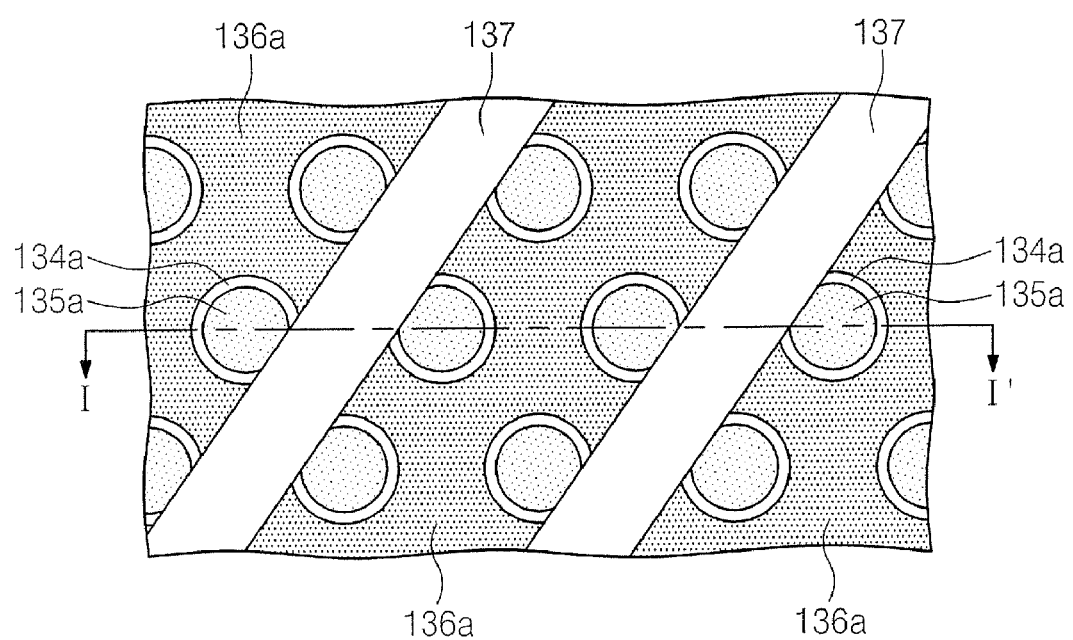

Referring to FIG. 10A and FIG. 10B, a third mask pattern 137 may be formed on the support insulation pattern 136a. The third mask pattern 137 may overlap portions of adjacent bottom electrodes 134a. The third mask pattern 137 may be a photoresist layer or a carbon-based layer. The C/O ratio may be 1 to 5 and the C/F ratio may be 1 to 0.2, when a carbon-based layer is used. As the third mask pattern 137 is disposed on the support insulation pattern 136a, the third mask pattern 137 may be formed in various different forms.

Figure 11A:
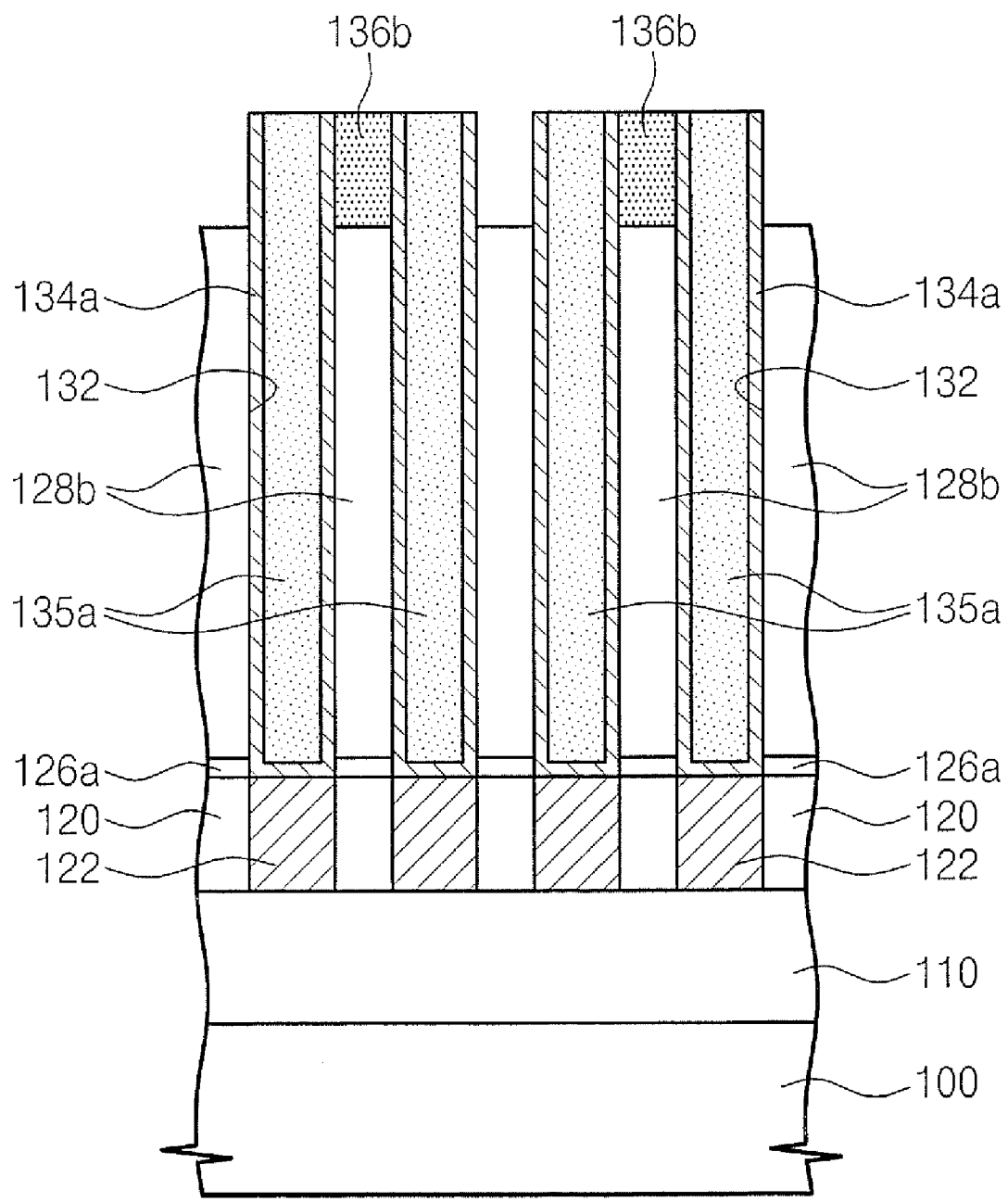
Figure 11B:
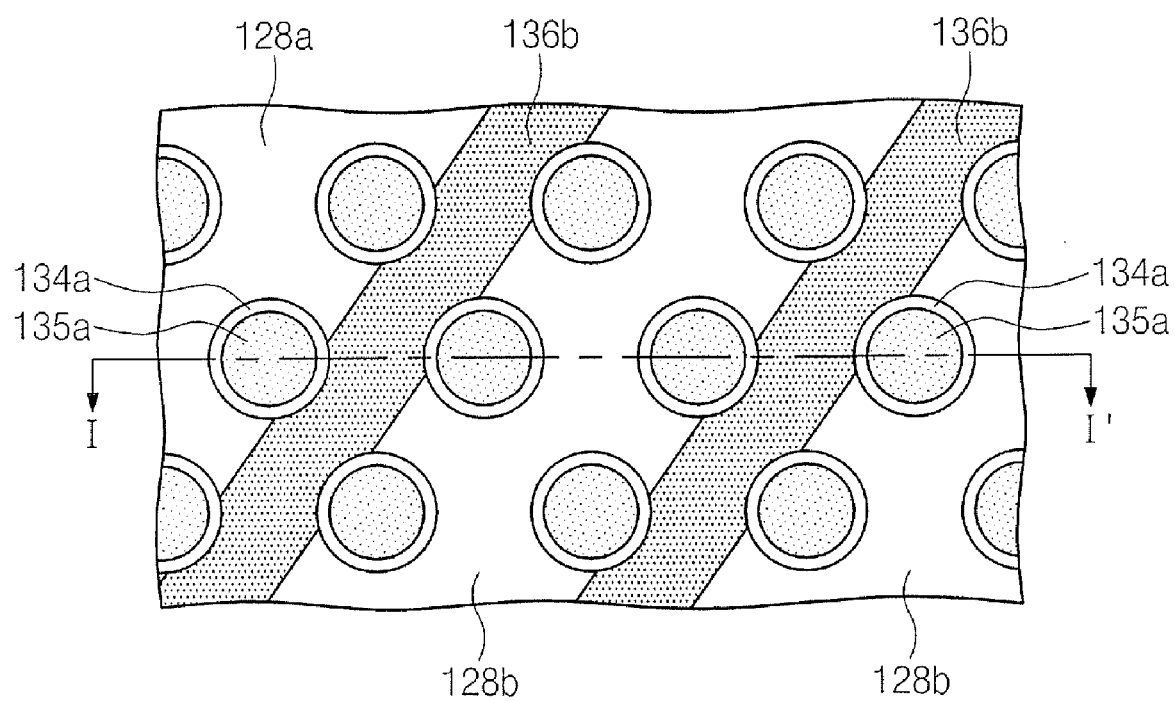

Referring to FIG. 11A and FIG. 11B, the support insulation pattern 136a is etched to form at least one support pattern 136b between the adjacent bottom electrodes 134a, using the third mask pattern 137 as the etch mask. The top or upper surface of the mold pattern 128b is exposed, except for portions of the top surface where the support patterns 136b are formed.

As the third mask pattern 137 may be formed in various forms, the support pattern 136b may be also be formed in various different forms. For example, the support pattern 136b may be interposed between consecutive adjacent bottom electrodes 134a. Also, the support pattern 136b may be disposed only between alternating ones of the adjacent bottom electrodes 134a. The third mask pattern 137 is removed, for example, by an ashing process.

Figure 12A:
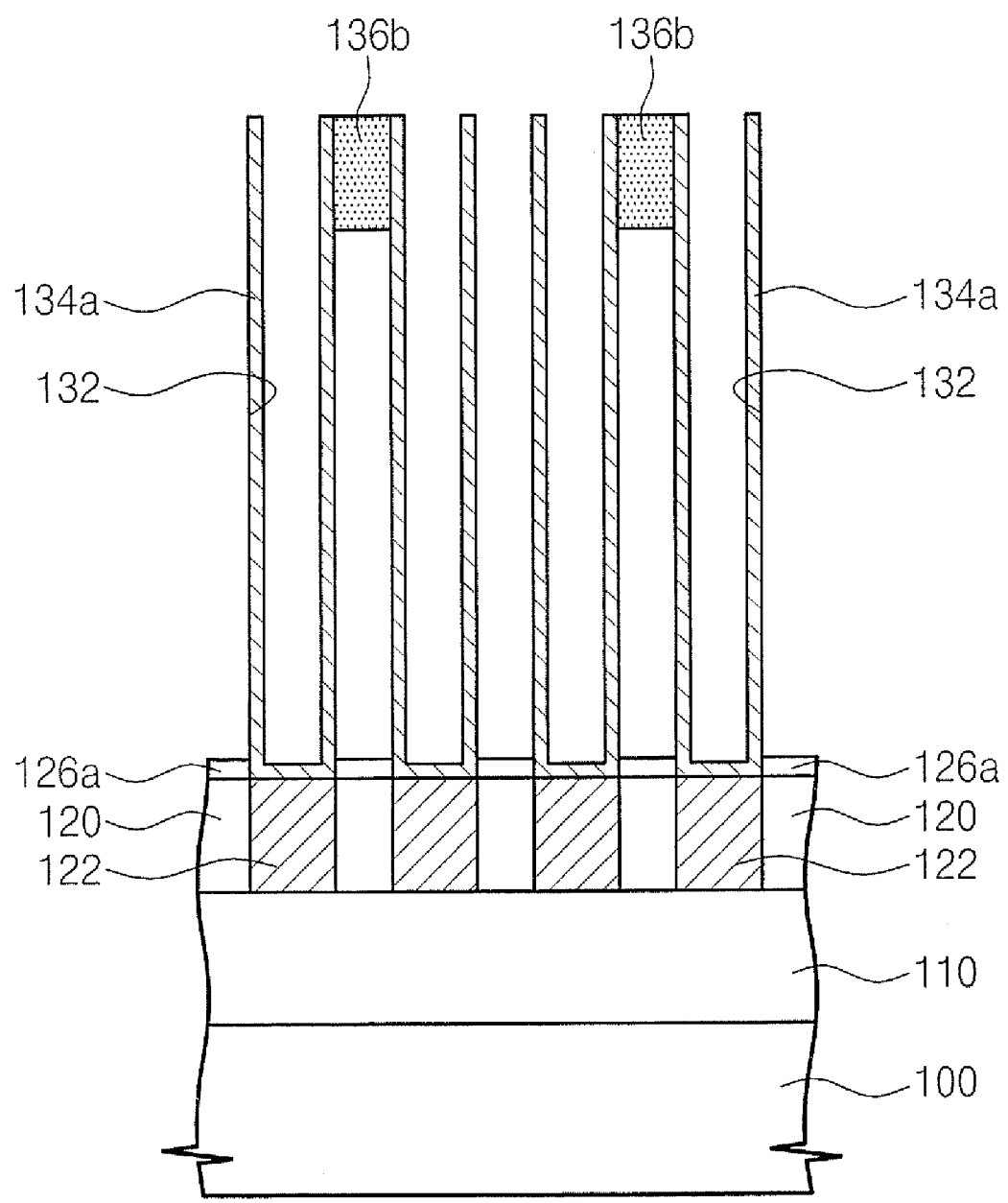
Figure 12B:
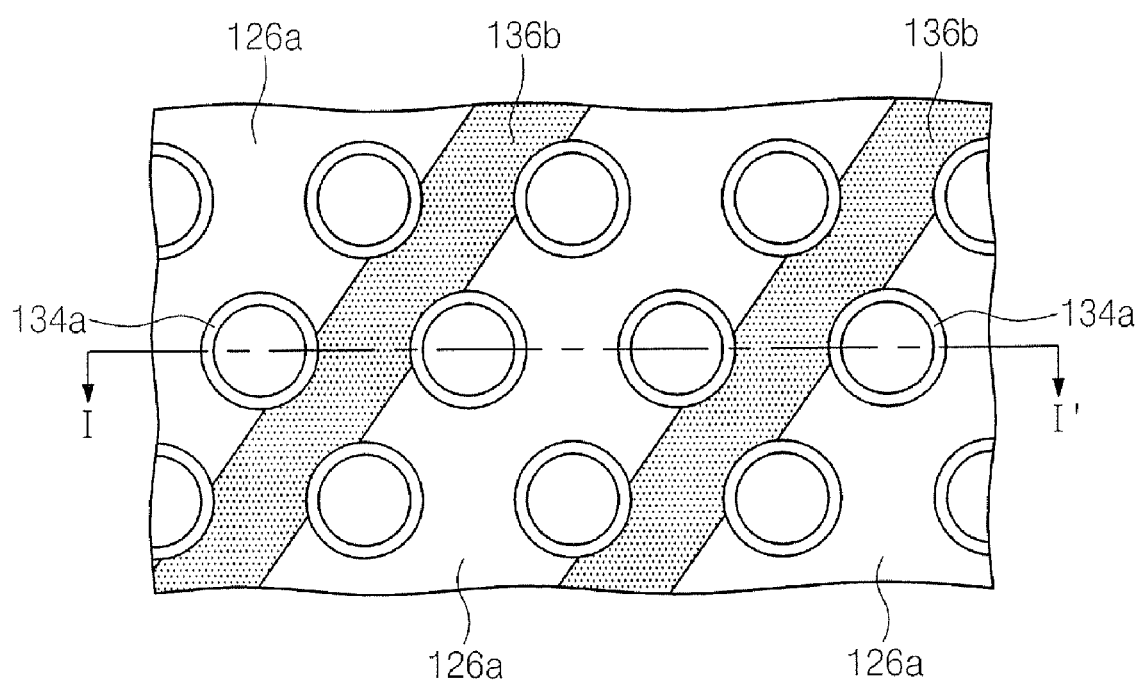

Referring to FIG. 12A and FIG. 12B, the mold pattern 128b and the sacrificial pattern 135a may be removed to expose the external wall and the internal wall of the bottom electrodes 134a. The eliminating process may be a wet etch process. The etchant solution of the wet etch process may contain hydrofluoric acid (HF). The support pattern 136b has an etch selectivity to the mold pattern 128b and the sacrificial pattern 135a. Also, the support pattern 136b may be made of a material having relatively good adhesion to the bottom electrodes 134a. The support pattern 136b may be adhered to the external or outer sidewalls of the bottom electrodes 134a to be interposed between adjacent bottom electrodes 134a.

Accordingly, the bottom electrodes 134a may be prevented from collapsing to prevent bridge between the bottom electrodes 134a.

Referring back to FIG. 1, a dielectric layer 138 may be formed on the exposed outer sidewalls and the inner sidewalls of the bottom electrodes 134a and on the support pattern 136b. The dielectric layer 138 may be a dielectric layer of the capacitor. A top or upper electrode 139 may be formed on the dielectric layer 138. The top electrode 139 may be plate electrode of the capacitor.

Figure 13:
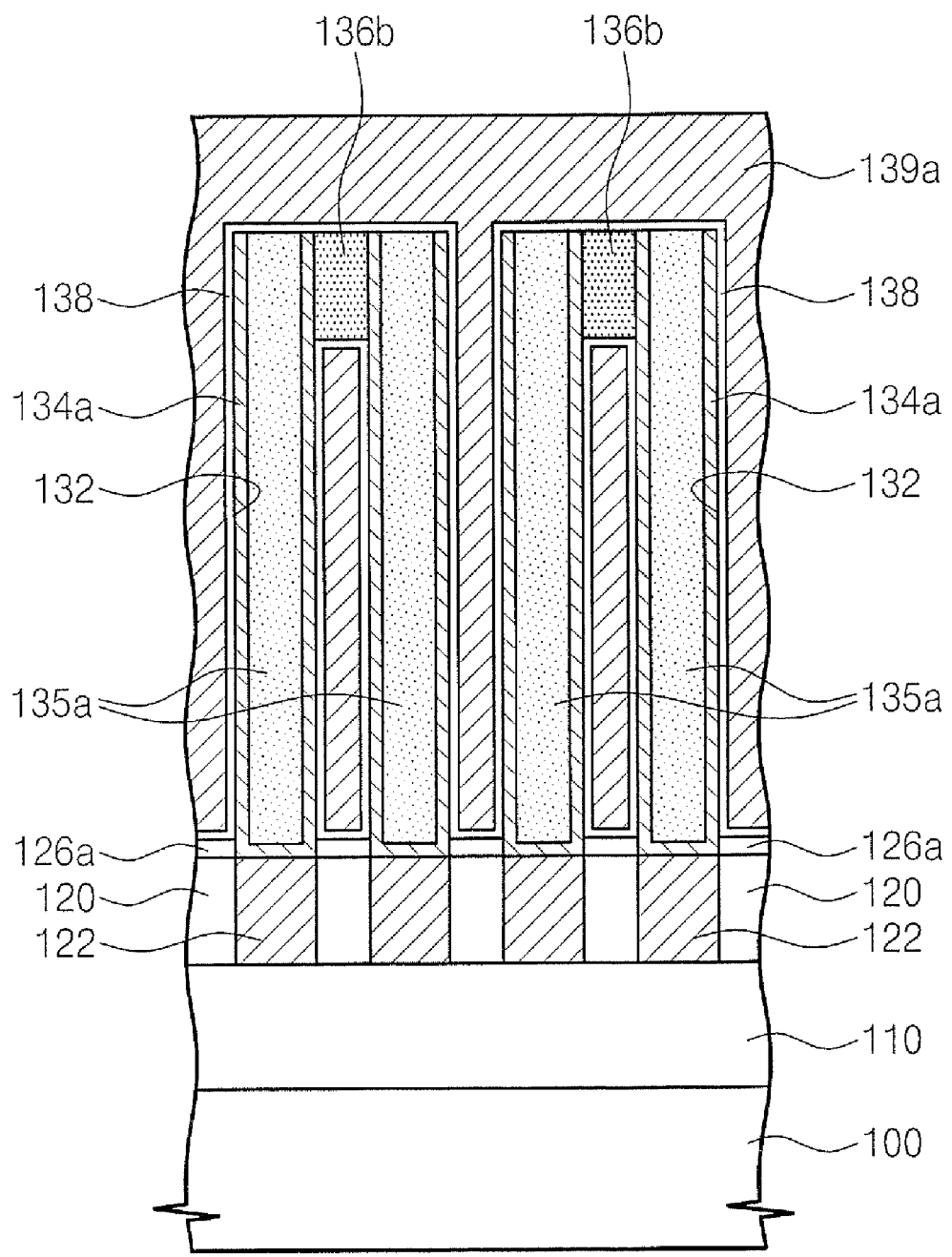
FIG. 13 is a cross-sectional view of a semiconductor device according to other embodiments of the present invention.

FIG. 13 is a cross-sectional view of a semiconductor device according to other embodiments of the present invention.

Referring to FIG. 13, a first interlayer dielectric 110 is provided on the semiconductor substrate 100. The first interlayer dielectric 110 may be made of silicon oxide ($SiO_2$). The first interlayer dielectric 110 may include a source region (not shown) formed on the semiconductor substrate 100 and an electrically connected conductor (not shown). A second interlayer dielectric 120 is provided on the first interlayer dielectric 110. The second interlayer dielectric 120 may be made of silicon oxide (SiO$_2$). A contact plug 122 extending through the second interlayer dielectric 120 is provided. The contact plug 122 may be electrically and physically connected with the conductor. A mask pattern 126a exposing the contact plug 122 is provided on the second interlayer dielectric 120. The mask pattern 126a may contain silicon nitride (SiN).

Bottom or lower capacitor electrodes 134a including internal (or inner) sidewalls and external (or outer) sidewalls are provided on the exposed contact plug 122. The bottom electrode 134a may be a storage electrode of the capacitor. For example, the bottom electrode 134a may contain titanium nitride (TiN). The bottom electrode 134a is in contact with a top or upper surface of the contact plug 122. A sacrificial pattern 135a between opposing inner sidewalls of the bottom electrode 134a is provided. The sacrificial pattern 135a may include silicon oxide or photoresist layer.

At least one support pattern 136b vertically extends between adjacent bottom electrodes 134a from top portions thereof toward the substrate 100. The support pattern 136b has an etch selectivity to an etchant solution containing hydrofluoric acid (HF). For example, the support pattern 136b may contain tantalum oxide (TaO). The support pattern 136b has thickness or depth vertically extending along the external sidewalls, and the thickness or depth may be greater than the distance between adjacent bottom electrodes 134a. Accordingly, the support pattern 136b may have a relatively high aspect ratio.

The support pattern 136b may be disposed in various different forms. For example, the support pattern 136b may be interposed between consecutive ones of the bottom electrodes 134a. Also, the support pattern 136b may be disposed between alternating ones of the bottom electrodes 134a. The support pattern 136b may therefore be disposed in various forms to support the bottom electrodes 134a.

A dielectric layer 138 is provided on the external sidewalls of the bottom electrodes 134a and on a top surface of the support pattern 136b. The dielectric layer 138 may be the dielectric layer of the capacitor. In some embodiments, the dielectric layer 138 may extend on more than one surface of the support pattern 136b, for example, on opposing top and bottom surfaces of the support pattern 136b. A top or upper electrode 139a covering the dielectric layer 138 is provided. The top electrode 139a may be a plate electrode of the capacitor.

Figure 14A:
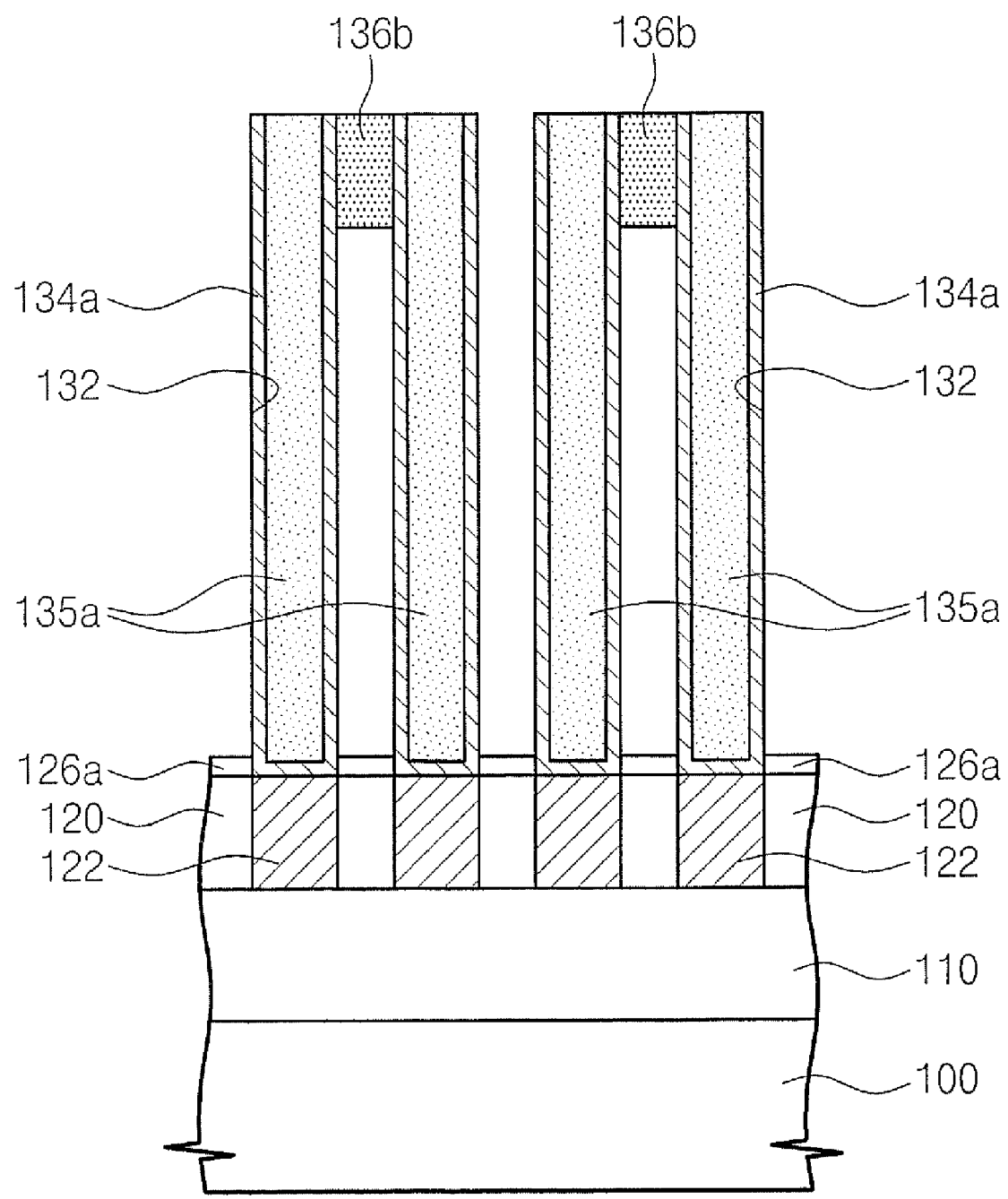
FIG. 14A is a cross-sectional view illustrating methods of forming semiconductor devices according to other embodiments.
Figure 14B:
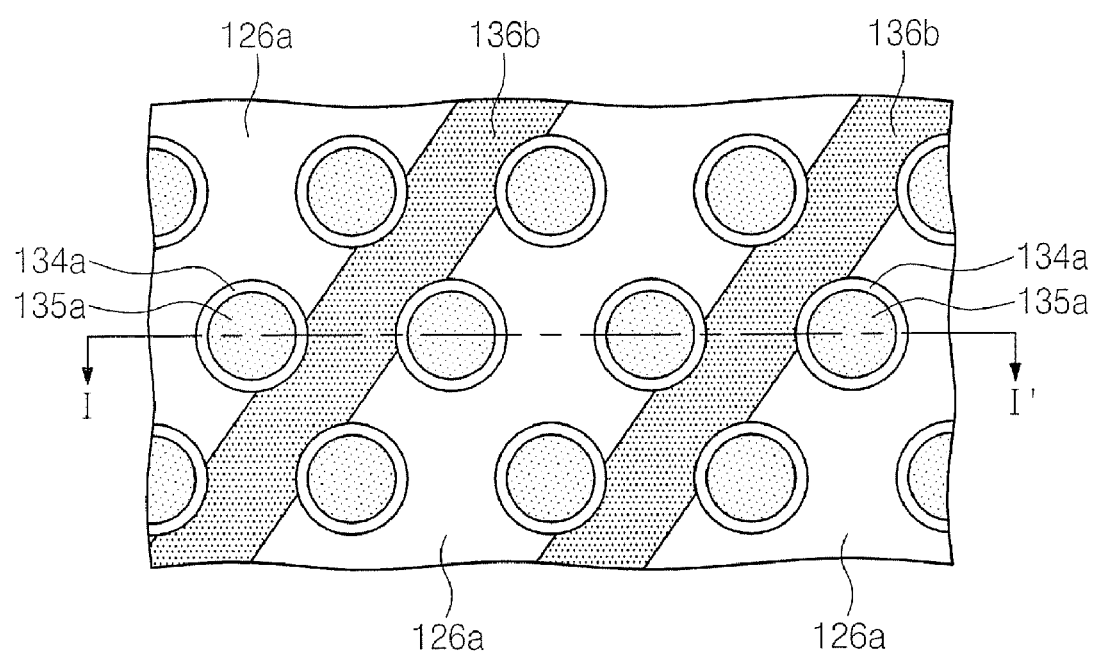
FIG. 14B is a plan view illustrating methods of forming semiconductor devices according to other embodiments.

FIG. 14A is a cross-sectional view illustrating methods of forming a semiconductor device according to other embodiments of the present invention. FIG. 14B is a plan view illustrating methods of forming a semiconductor device according to other embodiments of the present invention. FIG. 14A is a cross-sectional view cut along the line I-I' of FIG. 14A.

Referring to FIG. 14A and FIG. 14B, portions of the mold pattern 128b described with reference to FIG. 11A is removed to expose the outer sidewalls of some of the bottom electrodes 134a. The eliminating process may be performed by a wet etch process. The etchant solution of the wet etch process may contain hydrofluoric acid (HF). The support pattern 136b and the sacrificial pattern 135a may have an etch selectivity to the mold pattern 128a. The support pattern 136b may be made of material having relatively good adhesion to the bottom electrodes 134a. The support pattern 136b may be adhered to the outer sidewalls of the bottom electrodes 134a to be interposed between the bottom electrodes 134a. Therefore, the bottom electrodes 134a may be prevented from collapsing to reduce and/or prevent the occurrence of bridges between the bottom electrodes 134a.

Referring back to FIG. 13, a dielectric layer 138 may be formed on the exposed outer sidewalls of the bottom electrodes 134a. The dielectric layer 138 may be the dielectric layer of the capacitor. A top electrode 139a covering the dielectric layer 138 is provided. The top electrode 139a may be a plate electrode of the capacitor.

On the other hand, the aspect ratio of the bottom electrode 134a continues to increase. Accordingly, a simplified version of the above-described process of fabricating a capacitor may be used. In particular, in other embodiments of the present invention, the sacrificial pattern 135a may not be removed, which may simplify the capacitor forming process.

Although the present invention has been described in connection with the embodiments of the present invention illustrated in the accompanying drawings, it is not limited thereto. It will be apparent to those skilled in the art that various substitutions, modifications, and changes may be thereto without departing from the scope and spirit of the invention.

That which is claimed:

1. An integrated circuit device, comprising:
    a plurality of lower capacitor electrodes vertically extending from a substrate, the plurality of lower capacitor electrodes respectively including an inner sidewall and an outer sidewall;
    at least one support pattern vertically extending between ones of the plurality of lower capacitor electrodes from top portions thereof opposite the substrate and along the outer sidewalls thereof towards the substrate to a depth that is greater than a lateral distance between adjacent ones of the plurality of lower capacitor electrodes;
    a dielectric layer on the support pattern and on outer sidewalls of the plurality of lower capacitor electrodes; and
    an upper capacitor electrode on the dielectric layer.

2. The device of claim 1, wherein the support pattern has an etch selectivity to an etchant solution containing hydrofluoric acid.

3. The device of claim 2, wherein the support pattern comprises tantalum oxide.

4. The device of claim 1, wherein the plurality of lower capacitor electrodes comprise titanium nitride.

5. The device of claim 1, wherein the dielectric layer further extends on the inner sidewalls of the plurality of lower capacitor electrodes.

6. The device of claim 1, further comprising:
    a sacrificial pattern on the inner sidewalls of the plurality of lower capacitor electrodes.

7. The device of claim 1, wherein the support pattern extends between outer sidewalls of alternating ones of the plurality of lower capacitor electrodes.

8. The device of claim 1, wherein the dielectric layer further extends on opposing surfaces of the support pattern.

9. The device of claim 1, wherein the plurality of lower capacitor electrodes respectively comprise a cylindrically-shaped electrode vertically protruding from the substrate, wherein the inner sidewall comprises an inner surface of the cylindrically-shaped electrode that defines a cavity therein, and wherein the outer sidewall comprises an outer surface of the cylindrically-shaped electrode.

10. A method of forming an integrated circuit device, the method comprising:
    forming a plurality of lower capacitor electrodes vertically extending from a substrate, the plurality of lower capacitor electrodes respectively including an inner sidewall and an outer sidewall;
    forming at least one support pattern vertically extending between ones of the plurality of lower capacitor electrodes from top portions thereof opposite the substrate and along the outer sidewalls thereof towards the substrate to a depth that is greater than a lateral distance between adjacent ones of the plurality of lower capacitor electrodes;

forming a dielectric layer on the support pattern and on outer sidewalls of the plurality of lower capacitor electrodes; and forming an upper capacitor electrode on the dielectric layer.

11. The method of claim 10, wherein forming the plurality of lower capacitor electrodes comprises:

forming a mold layer including a plurality of recesses therein on the substrate;

forming a lower capacitor electrode layer conformally on the mold layer and along sidewalls of the plurality of recesses therein;

forming a sacrificial layer on the lower capacitor electrode layer to substantially fill the plurality of recesses; and planarizing the sacrificial layer and the lower electrode layer to expose the mold layer and define the plurality of lower capacitor electrodes and a sacrificial pattern on the inner sidewalls thereof.

12. The method of claim 11, wherein forming the support pattern comprises:

selectively recessing the exposed mold layer to form a mold pattern vertically extending between the plurality of lower capacitor electrodes from bottom portions thereof adjacent the substrate and along the outer sidewalls thereof away from the substrate, the mold pattern exposing upper portions of the outer sidewalls of the plurality of lower capacitor electrodes;

forming a support layer on the mold pattern and the sacrificial pattern, the support layer vertically extending between the plurality of lower capacitor electrodes and along the exposed upper portions of the outer sidewalls thereof towards the substrate;

planarizing the support layer to expose top portions of the plurality of lower capacitor electrodes and the sacrificial pattern to form a support insulation pattern; and patterning the support insulation pattern to form the at least one support pattern vertically extending between the ones of the plurality of lower capacitor electrodes.

13. The method of claim 12, wherein the plurality of lower capacitor electrodes comprise titanium nitride.

14. The method of claim 12, wherein the support layer has an etch selectivity to an etchant solution containing hydrofluoric acid.

15. The method of claim 14, wherein the support layer comprises tantalum oxide.

16. The method of claim 15, wherein selectively recessing the mold layer comprises selectively recessing the mold layer using a wet etching process.

17. The method of claim 12, wherein a length of the exposed upper portions of the outer sidewalls of the plurality of lower capacitor electrodes along a direction parallel to the outer sidewalls is greater than the lateral distance between immediately adjacent ones of the plurality of lower capacitor electrodes.

18. The method of claim 12, wherein the patterning the support insulation pattern comprises:

forming a mask pattern on portions of the support insulation pattern and overlapping portions of the ones of the plurality of lower capacitor electrodes; and etching the support insulation pattern to expose the mold pattern using the mask pattern as a etch mask.

19. The method of claim 18, wherein forming the mask pattern comprises:

forming the mask pattern on overlapping portions of alternating ones of the plurality of lower capacitor electrodes.

20. The method of claim 12, wherein forming the dielectric layer comprises:

after forming the support pattern, substantially removing portions of the mold pattern to expose the outer sidewalls of the plurality of lower capacitor electrodes;

substantially removing the sacrificial pattern to expose the inner sidewalls of the plurality of lower capacitor electrodes;

forming the dielectric layer on the exposed inner and outer sidewalls of the plurality of lower capacitor electrodes.

21. The method as claimed in claim 20, wherein the support pattern has an etch selectivity to the sacrificial pattern and the mold pattern.

22. The method as claimed in claim 12, wherein forming the dielectric layer comprises:

after forming the support pattern, substantially removing portions of the mold pattern without substantially removing the sacrificial pattern to expose the outer sidewalls of the plurality of lower capacitor electrodes; and forming the dielectric layer on the exposed outer sidewalls of the plurality of lower capacitor electrodes.

23. A method as claimed in claim 22, wherein the support pattern and the sacrificial pattern have an etch selectivity to the mold pattern.

* * * * *